United States Patent
Koh et al.

(10) Patent No.: US 7,994,807 B1
(45) Date of Patent: Aug. 9, 2011

(54) BUILT-IN TEST CIRCUIT FOR TESTING AC TRANSFER CHARACTERISTIC OF HIGH-SPEED ANALOG CIRCUIT

(75) Inventors: Yongseon Koh, Palo Alto, CA (US); Babak Matinpour, Sunnyvale, CA (US); Vijaya Ceekala, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 119 days.

(21) Appl. No.: 11/877,519

(22) Filed: Oct. 23, 2007

(51) Int. Cl.
*G01R 31/3187* (2006.01)
(52) U.S. Cl. ........... 324/750.3; 324/763.01; 324/762.01; 324/500; 327/108; 327/333
(58) Field of Classification Search .............. 324/158.1, 324/760–767; 361/56
See application file for complete search history.

(56) References Cited

U.S. PATENT DOCUMENTS

| | | | |
|---|---|---|---|
| 5,347,098 A * | 9/1994 | Murakami et al. | 219/61 |
| 5,689,183 A * | 11/1997 | Kohama | 324/233 |
| 6,449,307 B1 * | 9/2002 | Ishikawa et al. | 375/146 |
| 7,135,902 B1 | 11/2006 | Ziazadeh et al. | |
| 7,208,981 B1 | 4/2007 | Ziazadeh et al. | |
| 7,307,458 B1 * | 12/2007 | Segervall et al. | 327/108 |
| 7,454,647 B1 * | 11/2008 | Devnath et al. | 713/500 |
| 2007/0241285 A1 * | 10/2007 | Noyce et al. | 250/388 |
| 2008/0144243 A1 * | 6/2008 | Mariani et al. | 361/56 |

OTHER PUBLICATIONS

"National Semiconductor Introduces Industry's Lowest Jitter Cable Equalizer for Extending DVI and HDMI Cable Reach Beyond 40 Meters" Mar. 5, 2007, pp. 1-3.
"DS16EV5110 Video Equalizer for DVI, HDMI, and Cat5 Cables," Jun. 2007, pp. 1-18.

* cited by examiner

*Primary Examiner* — Huy Q Phan
*Assistant Examiner* — Trung Nguyen
(74) *Attorney, Agent, or Firm* — Steven J. Cahill

(57) ABSTRACT

An analog device under test circuit and a built-in test circuit for testing an AC transfer characteristic of the analog device under test are fabricated on an integrated circuit. The built-in test circuit includes an amplitude detector that detects the amplitude of the output signal of the analog device under test. The test time is reduced by sampling in real-time the DC value corresponding to the amplitude of the analog device under test. An additional reduction in the test time is achieved by using comparators with upper and lower limit reference signals and a pass-fail logic test.

17 Claims, 4 Drawing Sheets

BUILT-IN TEST CIRCUIT FOR TESTING AC TRANSFER CHARACTERISTIC OF HIGH-SPEED ANALOG CIRCUIT

BACKGROUND OF THE INVENTION

The present invention relates to electronic circuits, and more particularly, to techniques for testing the AC transfer characteristic of a high-speed analog circuit using a built-in test circuit.

The transfer function of an amplifier is typically tested using external test equipment that is outside the integrated circuit the amplifier is fabricated in. The external test equipment sweeps the frequency of an attenuated sinusoidal test input waveform to the amplifier to generate an output sinusoidal waveform. The output sinusoidal waveform of the amplifier is then digitized using a digitizer.

Test equipment with a high-frequency digitizer is used to achieve an adequate sampling rate of the output sinusoidal waveform. Even with a high-frequency digitizer, the sampling rate is often slower than the data rate of the amplifier. Therefore, the undersampled data are post-processed to reconstruct the waveform. However, digitizing the output waveform in a high-frequency domain and post-processing the data can significantly increase the test time.

Testing a device that has a large gain can be challenging. For example, equalizers used for high-speed non-return-to-zero (NRZ) signals are typically composed of an analog equalizer block with a 20–30 decibel (dB) gain and a limiting amplifier block with 30–40 dB gain that amplifies the output signal of the equalizer. In order to measure the linear gain of the analog equalizer block with the extra gain of the limiting amplifier block, the test input signal is extremely attenuated so that the output signal of the limiting amplifier is still linear and not limited.

However, attenuating the test input signal can increase the test time, because the attenuated test input signal may have a poor signal-to-noise ratio with respect to the noise floor of the test equipment. The measured data can be averaged to maintain accuracy, but the averaging process increases the test time even more.

DETAILED DESCRIPTION OF THE INVENTION

Some embodiments of the present invention include an analog device under test and a built-in test circuit that are fabricated on an integrated circuit. The built-in test circuit includes an amplitude detector that detects the amplitude of the output signal of the analog device under test during a test of the AC (alternating current) transfer characteristic of the analog device under test.

Various objects, features, and advantages of the present invention will become apparent upon consideration of the following detailed description and the accompanying drawings, in which like reference designations represent like features throughout the figures.

Figure 1:
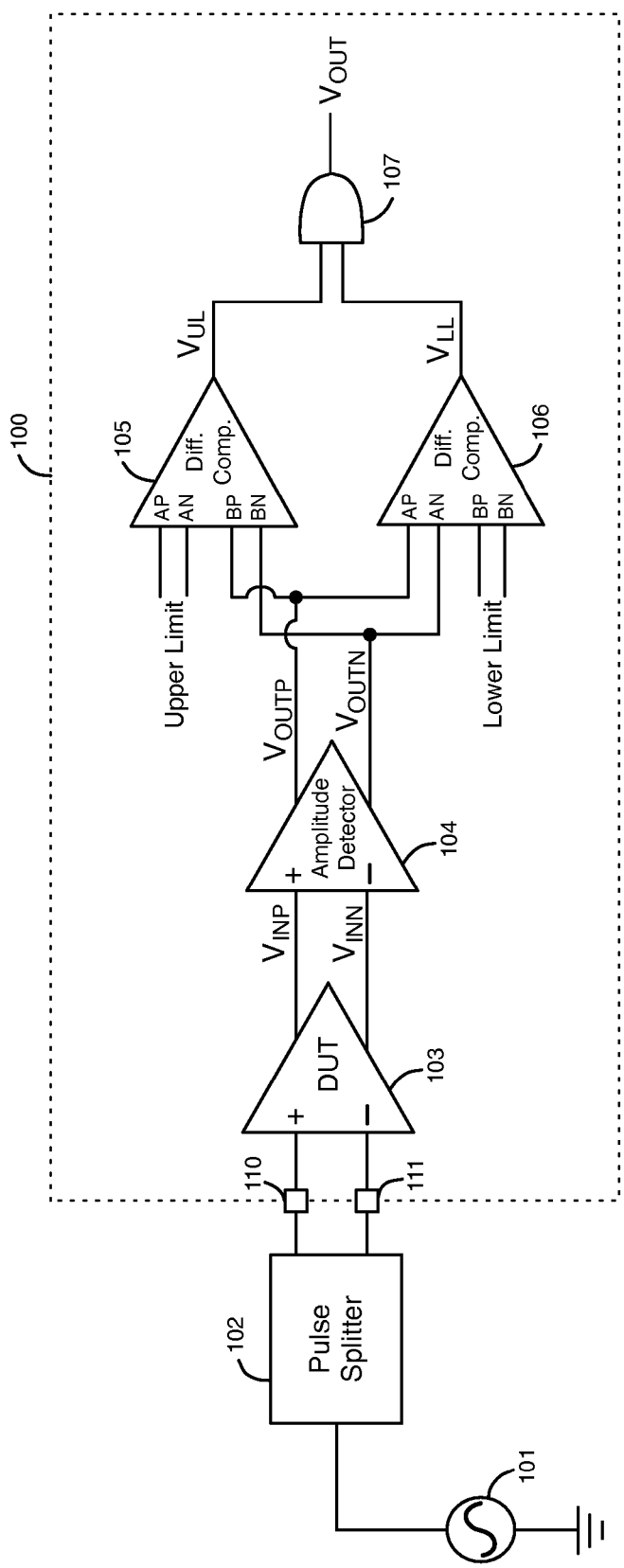
FIG. 1 illustrates a block diagram of a built-in test circuit, according to an embodiment of the present invention.

FIG. 1 illustrates a block diagram of a built-in test circuit, according to an embodiment of the present invention. FIG. 1 illustrates an input signal source 101, a pulse splitter circuit 102, a device under test (DUT) circuit 103, an amplitude detector circuit 104, a first differential comparator circuit 105, a second differential comparator circuit 106, and an AND logic gate circuit 107.

The built-in test circuit of FIG. 1 includes differential amplitude detector 104, differential comparators 105 and 106, and a Boolean logic AND gate 107, as shown in the block diagram of FIG. 1. The built-in test circuit of FIG. 1 is designed to test the output signal of DUT 103. Circuits 103, 104, 105, 106, and 107 are fabricated on an integrated circuit (IC) die 100. Thus, the built-in test circuit of FIG. 1 is built into the same integrated circuit die 100 as DUT 103. Input signal source 101 and pulse splitter 102 are typically external to IC die 100 (e.g., located on one or more separate ICs).

During a test of DUT 103, input signal source 101 generates a single-ended sinusoidal signal that is transmitted to an input of pulse splitter 102. Pulse splitter 102 converts the single-ended sinusoidal input signal from input signal source 101 into a differential sinusoidal signal. The two sinusoidal output signals of pulse splitter 102 are typically 180° out of phase with each other. Alternatively, pulse splitter 102 can be replaced with a balanced-to-unbalanced transformer (balun) that converts a single-ended sinusoidal input signal from source 101 into a differential sinusoidal output signal.

During a test of DUT 103, the differential sinusoidal signal generated by circuit 102 is applied to the non-inverting (+) and the inverting (−) input terminals of device under test (DUT) 103 through two input pins 110 and 111 (i.e., external terminals) of IC 100. Because a differential input signal is applied to the two input terminals of DUT 103 at the same time, both inputs of DUT 103 can be tested concurrently, rather than applying a single-ended input signal to one input of DUT 103 and grounding the second input. The non-inverting and inverting input terminals of DUT 103 are coupled to pins 110 and 111, respectively.

The built-in test circuit of FIG. 1 can be used to test a variety of analog circuits. DUT 103 is a high-speed, differential analog circuit such as an equalizer circuit, an amplifier circuit, or a filter circuit. For example, DUT 103 can be an active linear amplifier, a non-linear limiting amplifier, a linear equalizer, a passive equalizer, or another type of passive filter. These circuits are listed to provide examples of DUT 103 are not intended to limit the scope of the present invention.

As a more specific example, DUT 103 can be a linear equalizer that provides more gain to input frequencies within a selected bandwidth. The gain of the equalizer can be programmable. DUT 103 can also be a high-speed linear amplifier that can amplify frequencies greater than the sampling rate of a digitizer in external test equipment.

The built-in test circuit of FIG. 1 tests an AC (alternating current) transfer characteristic of high-speed differential analog DUT 103. The AC transfer characteristic tested by the built-in test circuit of FIG. 1 can be, for example, the AC transfer function of DUT 103. The built-in test circuit of FIG. 1 can, for example, measure the linear frequency response, the linear gain, or the amplitude of DUT 103. The built-in test circuit of FIG. 1 can measure, for example, the linear frequency response of any type of passive filter or any type of active amplifier. The built-in test circuit of FIG. 1 can also measure, for example, the amplitude of a non-linear limiting amplifier. The built-in test circuit of FIG. 1 can also measure, for example, the linear gain of a linear amplifier.

During a test of DUT 103, the frequency of the sinusoidal output signal generated by source 101 is swept over a selected frequency range. DUT 103 amplifies the sinusoidal signals from circuit 102 to generate differential sinusoidal output voltages $V_{INP}$ and $V_{INN}$. The output voltages $V_{INP}$ and $V_{INN}$ of DUT 103 are transmitted to the built-in test circuit, which includes circuits 104-107. Specifically, the output voltages $V_{INP}$ and $V_{INN}$ of DUT 103 are transmitted to the non-inverting (+) and the inverting (−) input terminals of amplitude detector 104, respectively.

According to an alternative embodiment, differential analog DUT 103 is replaced with a single-ended analog device under test (DUT) circuit. The single-ended output voltage of the single-ended analog DUT is transmitted to the non-inverting or the inverting input terminal of amplitude detector 104. A constant common-mode reference voltage is transmitted to the other input terminal of amplitude detector 104. The single-ended output voltage and the common-mode reference voltage function as a differential signal.

Amplitude detector 104 generates two differential output voltages $V_{OUTP}$ and $V_{OUTN}$. The voltage difference between $V_{OUTP}$ and $V_{OUTN}$ approximately equals the amplitude $V_{AMP}$ of differential input voltages $V_{INP}$ and $V_{INN}$. Output voltages $V_{OUTP}$ and $V_{OUTN}$ are DC (direct current) voltages or low frequency voltages. The AC transfer function of DUT 103 can be determined by measuring the output voltages of detector 104, while the frequency of the test signal generated by source 101 is swept over a desired bandwidth. Amplitude detector 104 is also referred to as a peak detector.

The output voltages $V_{OUTP}$ and $V_{OUTN}$ of amplitude detector 104 are transmitted to the input terminals of differential comparators 105 and 106. Differential comparators 105 and 106 each have four input terminals, AP, AN, BP, and BN. Output voltage $V_{OUTP}$ is transmitted to the BP input terminal of differential comparator 105 and to the AP input terminal of differential comparator 106. Output voltage $V_{OUTN}$ is transmitted to the BN input terminal of differential comparator 105 and to the AN input terminal of differential comparator 106. An Upper Limit threshold voltage is applied across the AP and AN input terminals of differential comparator 105. A Lower Limit threshold voltage is applied across the BP and BN input terminals of differential comparator 106.

Differential comparator 105 compares the difference between voltages $V_{OUTP}$ and $V_{OUTN}$ to the Upper Limit threshold voltage. The digital output voltage $V_{UL}$ of differential comparator 105 is a logic high when the difference between $V_{OUTP}$ and $V_{OUTN}$ is below the Upper Limit threshold voltage. The output voltage $V_{UL}$ of differential comparator 105 is a logic low when the difference between $V_{OUTP}$ and $V_{OUTN}$ is above the Upper Limit threshold voltage.

Differential comparator 106 compares the difference between voltages $V_{OUTP}$ and $V_{OUTN}$ to the Lower Limit threshold voltage. The digital output voltage $V_{LL}$ of differential comparator 106 is a logic high when the difference between $V_{OUTP}$ and $V_{OUTN}$ is above the Lower Limit threshold voltage. The output voltage $V_{LL}$ of differential comparator 106 is a logic low when the difference between $V_{OUTP}$ and $V_{OUTN}$ is below the Lower Limit threshold voltage.

The output voltages $V_{UL}$ and $V_{LL}$ of comparators 105 and 106 are applied to the two inputs of AND logic gate 107. The output voltage $V_{OUT}$ of AND logic gate 107 is a logic high when $V_{OUTP}-V_{OUTN}$ is within the voltage range defined by the Upper Limit and Lower Limit threshold voltages. The output voltage $V_{OUT}$ of AND logic gate 107 is a logic low when $V_{OUTP}-V_{OUTN}$ is above the Upper Limit threshold voltage or below the Lower Limit threshold voltage.

According to an alternative embodiment, a built-in test circuit of the present invention can include only one comparator that compares the output voltages of amplitude detector 104 to a single threshold voltage. This embodiment is useful in an application in which the amplitude of DUT 103 only needs to be compared against an upper limit or a lower limit, but not both.

According to one embodiment, the built-in test circuit of FIG. 1 can test the transfer function of DUT 103 and measure the linear gain, the frequency response, or the amplitude of DUT 103 in real-time using amplitude detector 104 without requiring time consuming post-processing steps. The transfer function of DUT 103 can, for example, be tested by using either real-time digitization in a low frequency domain or by using logic testing, thereby reducing the test time and the complexity of the built-in test circuit. Real-time digitization or logic testing can test the transfer function of DUT 103 based on the difference between $V_{OUTP}$ and $V_{OUTN}$ and the amplitude of the input voltage signals applied to DUT 103 with corresponding limits. The built-in test circuit of FIG. 1 reduces the test time of DUT 103, compared to the test time required using external test equipment, by sampling in real-time the DC value corresponding to the differential amplitude of analog DUT 103. The built-in test circuit of FIG. 1 achieves an additional reduction in the test time by using comparators with upper and lower limit reference signals and a pass-fail logic test.

After data generated from the built-in test circuit demonstrates that DUT 103 is functioning properly, DUT 103 is used to perform one or more functions during the normal operation of integrated circuit (IC) 100. DUT 103 can be used for many different purposes during the normal operation of IC 100.

DUT 103 is typically coupled to one or more other circuit elements (not shown) during the normal operation of IC 100. The other circuit elements can be on-chip or off-chip. For example, DUT 103 can be a linear equalizer circuit that drives a non-linear limiting amplifier circuit. In this example, the output terminals of equalizer 103 are coupled to the input terminals of the limiting amplifier. The non-linear limiting amplifier amplifies and limits the output signal of equalizer 103. The limiting amplifier can drive a buffer circuit or another type of circuit. The buffer circuit can drive signals to output pins or to other circuit elements on-chip.

Amplitude detector 104 does not detect the output signals of the limiting amplifier. Instead, the input terminals of amplitude detector 104 are coupled to the output terminals of DUT 103, as shown in FIG. 1. Therefore, amplitude detector 104 directly measures the amplitude of the output signals of equalizer 103. As a result, the input signals applied to equalizer 103 do not need to be attenuated to maintain the output signals of equalizer 103 linear and not limited. Larger test input signals can be applied to the inputs of equalizer 103, which relieves the constraints on the noise floor of the test circuit. The built-in test circuit of FIG. 1 can measure the linear gain of equalizer 103 very accurately without averaging data from many measurements, which reduces the test time.

Figure 2:
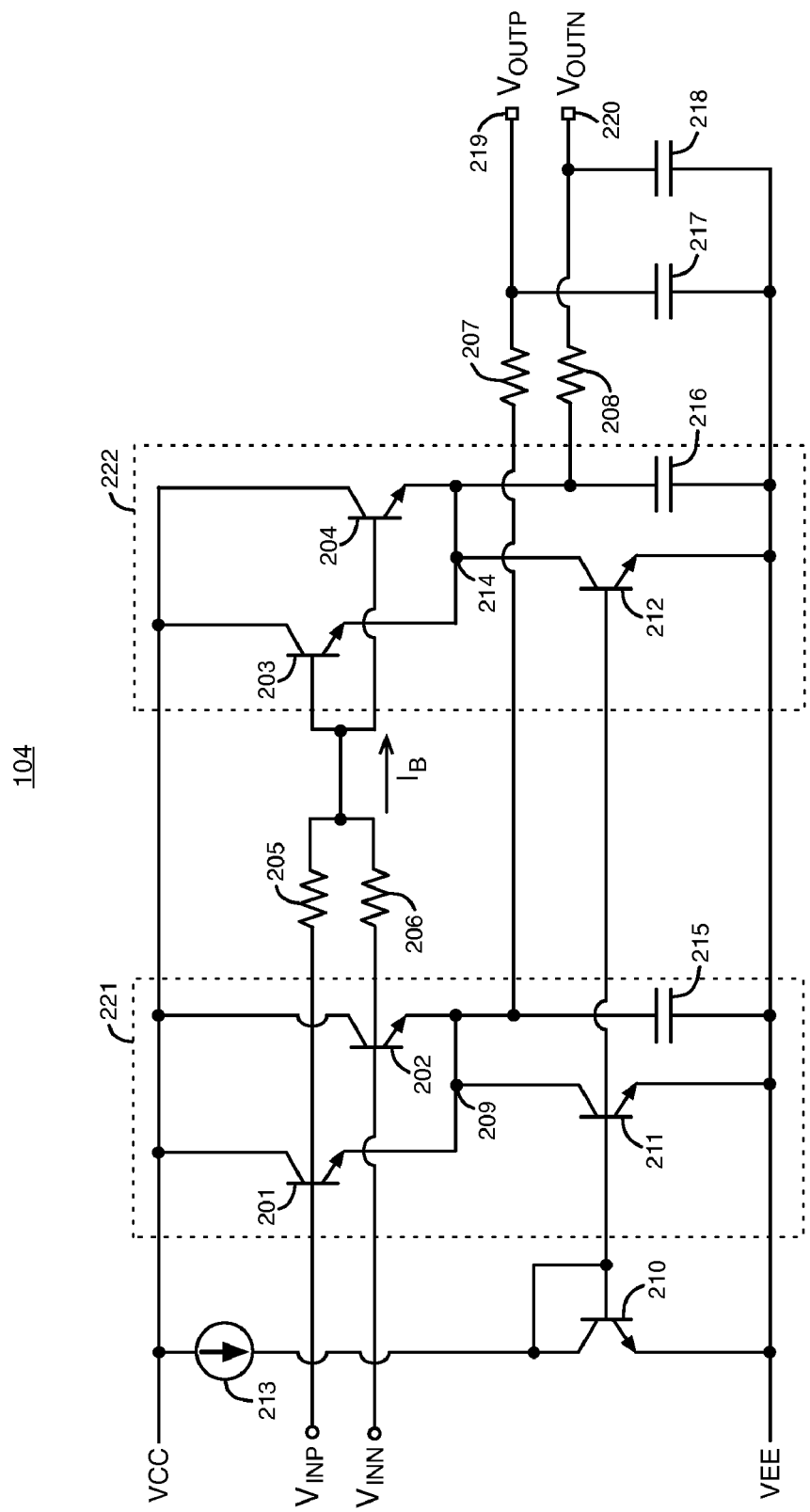
FIG. 2 illustrates a circuit schematic diagram of an amplitude detector, according to an embodiment of the present invention.

FIG. 2 illustrates a circuit schematic diagram of amplitude detector 104, according to an embodiment of the present invention. Amplitude detector 104 includes NPN bipolar junction transistors (BJTs) 201-204 and 210-212, resistors 205-208, current source 213, and capacitors 215-218.

Amplitude detector 104 includes a rectifier and level shifter circuit 221 and a replica circuit 222. Rectifier and level shifter circuit 221 detects the peak of the input voltages $V_{INP}$ and $V_{INN}$ and level shifts the peak voltage by a BJT base-emitter voltage $V_{BE}$. Replica circuit 222 detects the common mode voltage of input voltages $V_{INP}$ and $V_{INN}$ and level shifts the common mode voltage by a BJT base-emitter voltage $V_{BE}$. The differential output voltage ($V_{OUTP}-V_{OUTN}$) of amplitude detector 104 is the amplitude of the input voltages $V_{INP}$ and $V_{INN}$.

Rectifier and level shifter circuit 221 includes a differential pair of BJTs 201-202. The base of BJT 201 is coupled to receive input voltage $V_{INP}$ at the non-inverting (+) input of amplitude detector 104. The base of BJT 202 is coupled to receive input voltage $V_{INN}$ at the inverting (−) input of amplitude detector 104. The collectors of BJTs 201 and 202 are coupled to receive high supply voltage VCC.

Rectifier and level shift circuit 221 also includes BJT 211 and capacitor 215. The collector of BJT 211 is coupled to the emitters of BJTs 201 and 202 at node 209, and the emitter of BJT 211 is coupled to low supply voltage VEE. The base of BJT 211 is coupled to the base and the collector of BJT 210. BJT 210 is coupled to current source 213.

BJTs 210, 211, and 212 form a current mirror circuit. Current source 213 generates the collector current of BJT 210, which is the reference current for the current mirror circuit. The output current of current source 213 is mirrored through BJTs 211 and 212, according to relative sizes of BJTs 210-212. BJT 211 functions as a current source for differential pair 201-202.

The differential input voltage between $V_{INP}$ and $V_{INN}$ steers the bias current in differential pair 201-202. BJTs 201 and 202 are emitter followers. The emitter follower 201 or 202 that is dominant sets the voltage at the common emitter node 209. Capacitor 215 is coupled in parallel with BJT 211 between the emitters of BJTs 201 and 202 and VEE.

$V_{OUTP}$ and $V_{OUTN}$ are the output voltages of amplitude detector 104 at output nodes 219 and 220, respectively. The differential output voltage of amplitude detector 104 is the difference between $V_{OUTP}$ and $V_{OUTN}$.

The positive output 219 of amplitude detector 104 is coupled to the emitters of BJTs 201 and 202 through resistor 207. The output voltage $V_{OUTP}$ is obtained from the capacitor-coupled common emitter node 209 of emitter followers 201-202, which are driven by the differential input voltage. Rectifier and level shifter circuit 221 level-shifts the input voltage by a base-emitter voltage $V_{BE}$ across the dominant emitter follower at node 209. Rectifier and level shifter circuit 221 then rectifies the level-shifted input voltage with respect to a common mode voltage using capacitor 215 and detects the envelope of the rectified and level-shifted signal.

Capacitor 217 is coupled between output node 219 and VEE. Capacitor 217 and resistor 207 form a low pass filter that attenuates high frequency signals in $V_{OUTP}$. The DC output voltage $V_{OUTP}$ is the level shifted peak voltage of the differential input signal.

Replica circuit 222 includes a differential pair of BJTs 203-204, BJT 212, and capacitor 216. BJTs 203-204 are coupled between VCC and common emitter node 214. BJT 212 and capacitor 216 are coupled in parallel between common emitter node 214 and VEE. BJT 212 is a current source for BJTs 203 and 204.

The base of BJT 203 is coupled to the base of BJT 204. Resistors 205 and 206 are coupled in series between the base of BJT 201 and the base of BJT 202. The bases of BJTs 203 and 204 are coupled together between resistors 205 and 206.

Input voltage $V_{INP}$ equals the input common mode voltage $W_{CM}$ plus or minus the voltage amplitude $V_{AMP}$ of the differential input voltage, $V_{INP}=V_{CM}\pm V_{AMP}$. Input voltage $V_{INN}$ equals the input common mode voltage $W_{CM}$ minus or plus voltage amplitude $V_{AMP}$, $V_{INN}=V_{CM}\mp V_{AMP}$. By combining the input voltages $V_{INP}$ and $V_{INN}$ using large resistors 205-206, the input common mode voltage $V_{CM}$ appears at the bases of BJTs 203-204. A small voltage drop exists across each filter resistor 205-206 as a result of the base current of BJTs 203-204, which is negligible for large input signals.

The negative output 220 of amplitude detector 104 is coupled to the emitters of BJTs 203 and 204 through resistor 208. The common mode voltage is level shifted by a base-emitter voltage $V_{BE}$ of BJTs 203 and 204 at common emitter node 214 and then filtered by capacitor 216.

Capacitor 218 is coupled between output node 220 and VEE. Capacitor 218 and resistor 208 form a low pass filter that attenuates high frequency signals in $V_{OUTN}$. The DC output voltage $V_{OUTN}$ is the level shifted common mode voltage of $V_{INP}$ and $V_{INN}$, minus a small voltage drop across resistors 205-206.

The resulting differential output voltage between $V_{OUTP}$ and $V_{OUTN}$ is the voltage amplitude $V_{AMP}$ of the differential input voltages $V_{INP}$ and $V_{INN}$. Replica circuit 222 cancels variations in the common mode voltage of $V_{INP}$ and $V_{INN}$. Replica circuit 222 also cancels variations in the base-emitter voltages $V_{BE}$ of the NPN bipolar junction transistors (BJTs). The resulting differential output voltage $V_{AMP}$ is independent of variations in the common mode voltage. The differential output voltage $V_{AMP}$ is also independent of variations in the base-emitter voltages $V_{BE}$ of the NPN BJTs.

The output voltage $V_{OUTP}$ is based on equation (1), the output voltage $V_{OUTN}$ is based on equation (2), and the differential output voltage $V_{OUTP}-V_{OUTN}$ is based on equation (3).

$$V_{OUTP} = V_{CM} + V_{AMP} - V_{BE} \qquad (1)$$

$$V_{OUTN} = V_{CM} - \frac{I_B R}{2} - V_{BE} \qquad (2)$$

$$V_{OUTP} - V_{OUTN} = V_{AMP} + \frac{I_B R}{2} \approx V_{AMP}, \text{ for } V_{AMP} \gg \frac{I_B R}{2} \qquad (3)$$

In equations (2) and (3), current $I_B$ equals the base current flowing into the bases of BJT 201 and 202. Because the dominant BJT in differential pair 201-202 conducts most of the current provided by BJT 211, $I_B/2$ represents the average DC current through resistors 205 and 206. In equations (2) and (3), R equals the resistance $R_{205}$ of resistor 205 and the resistance $R_{206}$ of resistor 206 (i.e., $R=R_{205}=R_{206}$).

As shown in equation (3), the differential output voltage approximately equals $V_{AMP}$ when $I_B R/2$ is much smaller than $V_{AMP}$. When the voltage amplitude $V_{AMP}$ is small (e.g., less than 30 mV), the effect of the base current $I_B$ through resistors 205 and 206 causes the gain of DUT 103 as measured by amplitude detector 104 to be different than the actual gain of DUT 103 by a small amount.

Figure 3:
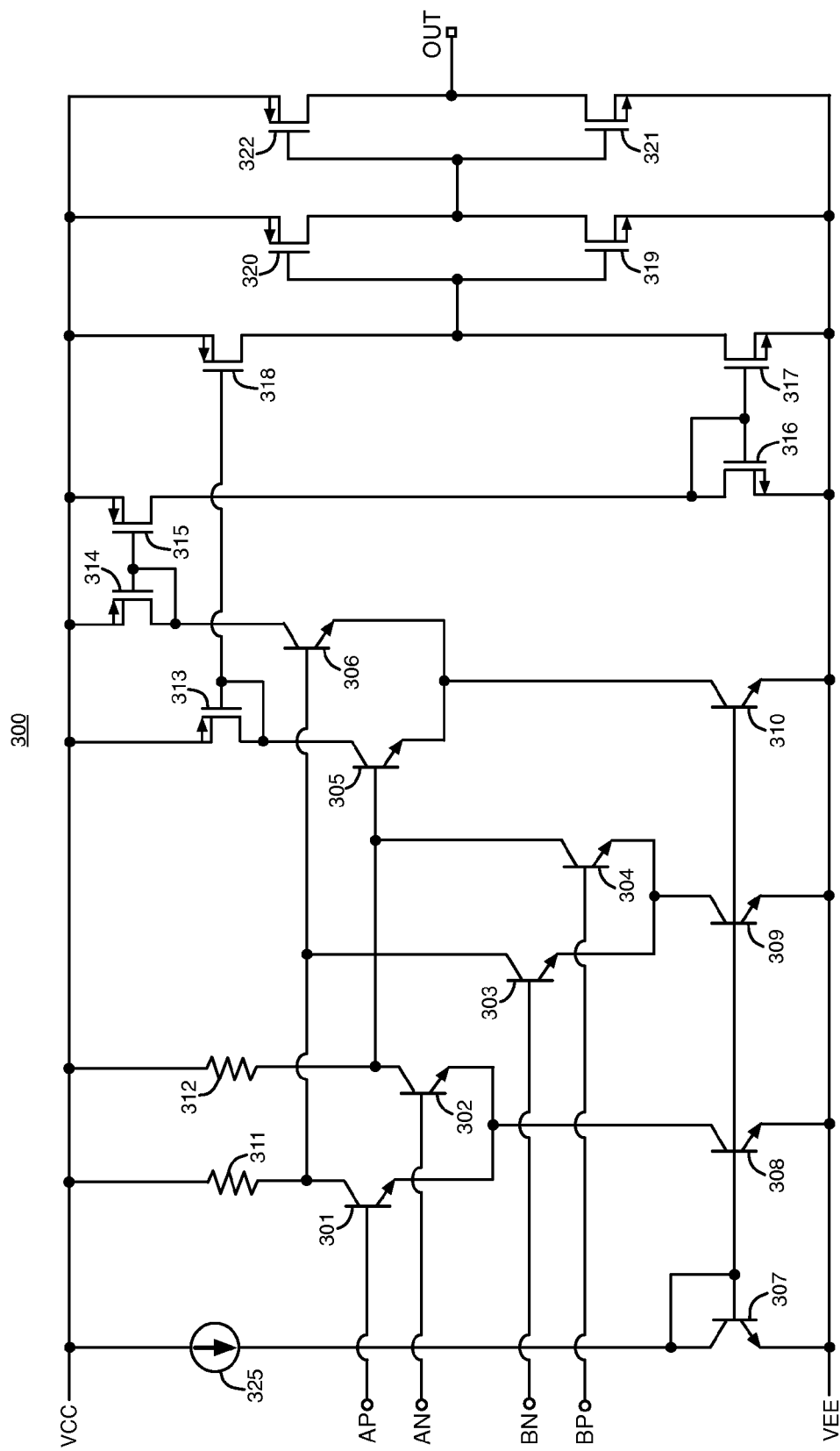
FIG. 3 illustrates a circuit schematic diagram of a fully differential comparator, according to an embodiment of the present invention.

FIG. 3 illustrates a circuit schematic diagram of a fully differential comparator 300, according to an embodiment of the present invention. Differential comparator 300 is one example of a circuit that can be used to implement differential comparators 105 and 106 shown in FIG. 1. Alternatively, other differential comparator configurations can be used to implement differential comparators 105 and 106.

Differential comparator 300 receives four input voltages at the AP, AN, BP, and BN input terminals. The output voltage of differential comparator 300 at output terminal OUT equals $G((V_{AP}-V_{AN})-(V_{BP}-V_{BN}))$, where G is the gain factor of the comparator, $V_{AP}$ is the voltage at AP, $V_{AN}$ is the voltage at AN, $V_{BP}$ is the voltage at BP, and $V_{BN}$ is the voltage at BN.

Differential comparator 300 includes a differential subtractor, a differential gain stage, and a differential-to-single-ended converter. The differential subtractor includes two differential pairs of bipolar junction transistors (BJTs). NPN BJTs 301-302 form the first differential pair, and NPN BJTs 303-304 form the second differential pair. The base of BJT 301 is coupled to the AP input terminal, the base of BJT 302 is coupled to the AN input terminal, the base of BJT 303 is coupled to the BN input terminal, and the base of BJT 304 is coupled to the BP input terminal.

Resistors 311-312 are passive load resistors for the two differential pairs of BJTs. Resistors 311-312 are coupled to supply voltage VCC. Resistor 311 is coupled to the collectors of BJTs 301 and 303. Resistor 312 is coupled to the collectors of BJTs 302 and 304.

NPN BJTs 307-310 are a current mirror. The collector of BJT 307 is coupled to current source 325. The current generated by current source 325 is the collector current of BJT 307 and the reference current of the current mirror. The reference current is mirrored to BJTs 308-310, according to the relative sizes of BJTs 307-310. BJT 308 is a current source for differential pair 301-302, and BJT 309 is a current source for differential pair 303-304.

Differential pair 301-302 and differential pair 303-304 generate differential output currents that have the opposite polarity. The output currents of BJTs 301 and 303 are summed together at the base of BJT 306 and converted to voltage by resistor 311. The output currents of BJTs 302 and 304 are summed together at the base of BJT 305 and converted to a voltage by resistor 312.

The differential gain stage includes a third differential pair of NPN BJTs 305-306. BJTs 305-306 differentially amplify the output voltages of the subtractor stage that appear at the bases of BJTs 305 and 306. BJT 310 is the current source for BJTs 305-306.

The single-to-differential converter includes p-channel metal oxide semiconductor field-effect transistors (MOSFETs) 313-315, 318 and n-channel MOSFETs 316-317. MOSFETs 313-318 convert the differential collector currents of BJTs 305 and 306 into a single-ended voltage at the drains of MOSFETs 317 and 318. Two inverters formed by MOSFETs 319-320 and 321-322 buffer the single-ended voltage to generate an output voltage of the differential comparator at output node OUT.

Figure 4:
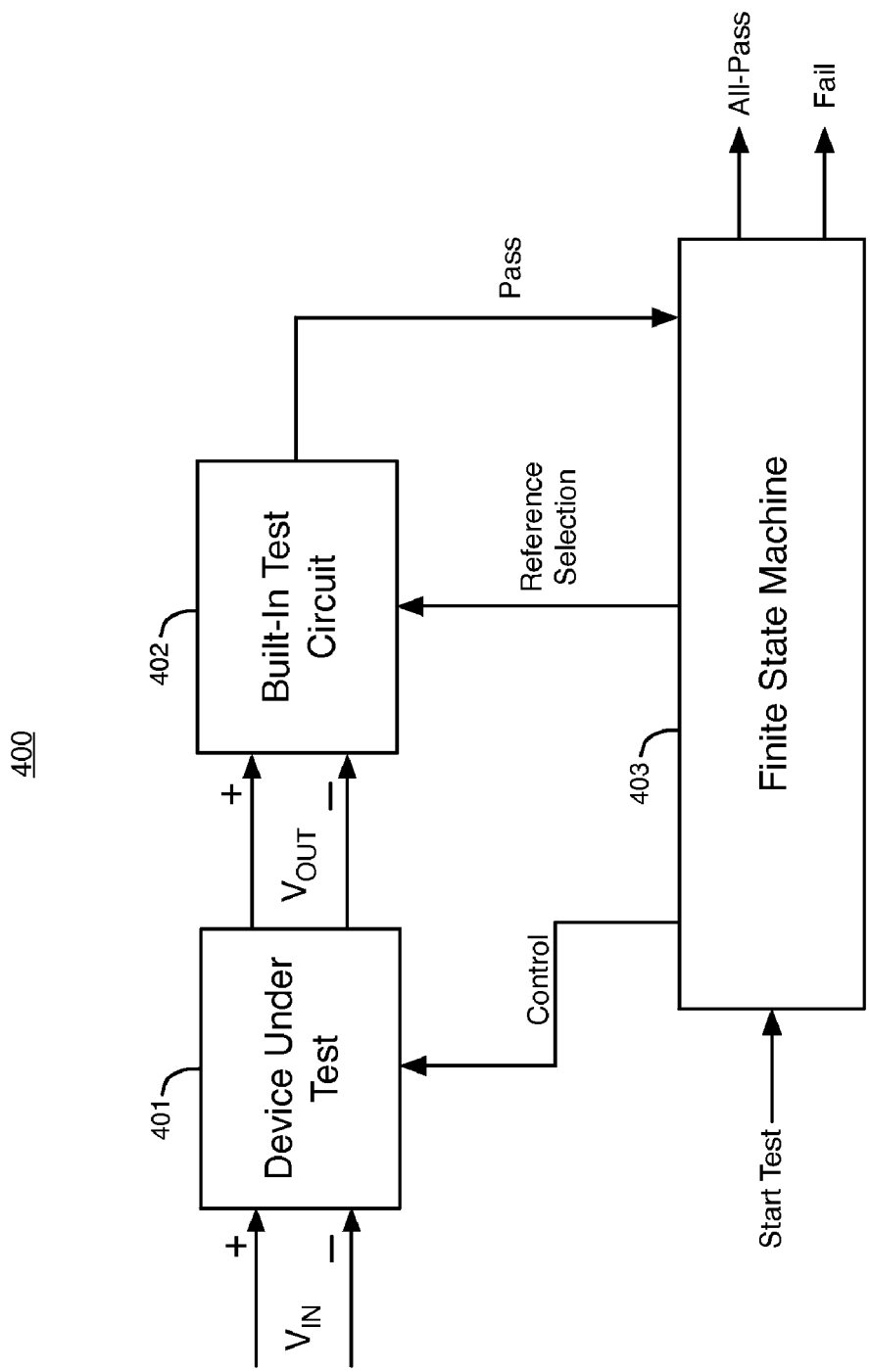
FIG. 4 illustrates a built-in self-test system for self-testing a device under test, according to an embodiment of the present invention.

FIG. 4 illustrates a built-in self-test system 400 for self-testing a device under test, according to an embodiment of the present invention. Built-in self-test system 400 can perform a fully automated self-test of an analog device under test (DUT) 401 without manual intervention. Built-in self-test system 400 includes analog device under test 401, built-in test circuit 402, and finite state machine (FSM) 403.

The DUT 401 and test components 402-403 can be fabricated on one integrated circuit (IC) die. In this embodiment, self-test system 400 is an internal test system because components 402-403 are located on the same IC as DUT 401.

Alternatively, DUT 401 and built-in test circuit 402 are fabricated on one IC die, and FSM 403 is fabricated on a separate IC die. In this embodiment, DUT 401 and built-in test circuit 402 are controlled by an external finite state machine 403, or alternatively, a processor, controller, CPU, or some other type of control circuit.

Device under test 401 can be, for example, a linear equalizer, an amplifier, or a filter. Built-in test circuit 402 can, for example, include amplitude detector 104, differential comparators 105-106, and AND gate 107. Instead of amplitude detector 104, built-in test circuit 402 can include another type of rectifier circuit that converts an AC input signal from DUT 401 into a DC output signal, according to an alternative embodiment.

Finite state machine (FSM) 403 controls the testing of device under test (DUT) 401. A Start Test signal is sent to FSM 403 to begin a test of DUT 401. After FSM 403 receives the Start Test signal, FSM 403 transmits a Control signal to DUT 401. The Control signal determines a control setting of DUT 401. For example, DUT 401 can select a voltage gain transfer function for $V_{OUT}/V_{IN}$ in response to a value of the Control signal.

DUT 401 generates a differential output voltage signal $V_{OUT}$ in response to a differential input voltage signal $V_{IN}$. Built-in test circuit 402 detects the amplitude of the output voltage signal $V_{OUT}$ using a rectifier circuit, such as amplitude detector 104, as described above with respect to FIG. 2.

After receiving the Start Test signal, FSM 403 also transmits one or more Reference Selection signals to built-in test circuit 402. Built-in test circuit 402 selects one or more reference signals in response to the values of the Reference Selection signals. Built-in test circuit 402 compares the detected amplitude of the output voltage $V_{OUT}$ to the selected reference signals. For example, comparators 105 and 106 described above compare the detected amplitude of the DUT differential output signal to the Upper Limit and Lower Limit reference signals. Thus, the Upper and Lower Limit reference signals vary based on the one or more Reference Selection signals.

Built-in test circuit 402 generates a Pass signal (e.g., the output voltage of AND gate 107) in response to the result of the comparison between the detected amplitude of the output voltage $V_{OUT}$ and the selected reference signals. The Pass signal indicates if the output voltage $V_{OUT}$ of DUT 401 falls within the voltage range that is selected by the one or more Reference Selection signals. The Pass signal is transmitted to FSM 403.

After FSM 403 has received the Pass signal, FSM 403 can perform additional tests of DUT 401 by varying the Control and Reference Selection signals. FSM 403 can select different reference signals for testing the range of the amplitude of the output voltage of DUT 401 by varying the states of the Reference Selection signals. FSM 403 can include memory for storing the value of the Pass signal after each test. FSM 403 generates an All-Pass signal if the Pass signal indicates that the amplitude of the output voltage of DUT 401 falls within the range or ranges selected by the Reference Selection signals for each test performed. If the amplitude of the output voltage of DUT 401 has not fallen within the range selected by the Reference Selection signals for one or more of the tests, FSM 403 can generate a Fail signal.

According to another embodiment, the Control and Reference Selection signals can be generated by test equipment that is external to the IC die that contains DUT 401 and built-in test circuit 402. In this embodiment, FSM 403 is not used to test DUT 401. Instead, the Control and Reference Selection signals are applied to input pins on the IC for transmission to DUT 401 and circuit 402. A user can control the test equipment manually to set and adjust the values of the Control and Reference Selection signals. The Pass signal generated by the built-in test circuit 402 is transmitted to the test equipment through an output pin for evaluation by the user.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, variations, and substitutions are possible in light of the above teachings, without departing from the scope of the present invention.

What is claimed is:

1. An integrated circuit comprising:
an analog device under test circuit; and
a built-in test circuit comprising an amplitude detector that detects an amplitude of an output signal of the analog device under test circuit during a test of an AC transfer characteristic of the analog device under test circuit,
wherein the built-in test circuit further comprises a first comparator circuit configured to compare an amplitude signal generated by the amplitude detector to a first reference signal, wherein the amplitude signal indicates the amplitude of the output signal of the analog device under test circuit, and
wherein the built-in test circuit further comprises a second comparator circuit configured to compare the amplitude signal to a second reference signal, and a logic gate coupled to receive output signals of the first and the second comparator circuits.

2. The integrated circuit defined in claim 1 wherein:
the analog device under test circuit is an equalizer circuit.

3. The integrated circuit defined in claim 1 wherein the analog device under test circuit is an amplifier circuit.

4. The integrated circuit defined in claim 1 further comprising a finite state machine that controls the built-in test circuit during the test and that generates a control signal for controlling a gain of the analog device under test circuit.

5. An integrated circuit comprising:
an analog device under test circuit; and
a built-in test circuit comprising an amplitude detector that detects an amplitude of an output signal of the analog device under test circuit during a test of an AC transfer characteristic of the analog device under test circuit,
wherein the amplitude detector comprises:
a first differential pair of transistors;
a second differential pair of transistors;
a first capacitor coupled to emitters of the first differential pair of transistors; and
a second capacitor coupled to emitters of the second differential pair of transistors.

6. The integrated circuit defined in claim 5 wherein the amplitude detector further comprises:
a first resistor coupled to the first capacitor and a first output of the amplitude detector; and
a second resistor coupled to the second capacitor and a second output of the amplitude detector.

7. The integrated circuit defined in claim 5 wherein the amplitude detector further comprises:
a first resistor coupled to a first input of the amplitude detector; and
a second resistor coupled to a second input of the amplitude detector, wherein bases of the transistors in the second differential pair are coupled together and to the first and the second resistors.

8. An integrated circuit comprising:
an analog device under test circuit;
a built-in test circuit comprising an amplitude detector that detects an amplitude of an output signal of the analog device under test circuit during a test of an AC transfer characteristic of the analog device under test circuit;
a comparator circuit that compares an amplitude signal generated by the amplitude detector to a reference signal, wherein the amplitude signal indicates the amplitude of the output signal of the analog device under test circuit; and
a finite state machine that generates a control signal for controlling a gain of the analog device under test circuit, that generates a reference selection signal for selecting a voltage of the reference signal, and that generates a test output signal in response to a pass signal generated based on an output signal of the comparator circuit.

9. An integrated circuit comprising:
a device under test selected from the group consisting of an amplifier circuit, a filter circuit, and an equalizer circuit;
a built-in test circuit comprising an amplitude detector that generates an amplitude signal indicative of an amplitude of an output signal of the device under test during a test of an AC transfer characteristic of the device under test, wherein the amplitude detector is coupled to receive the output signal of the device under test;
a first comparator circuit configured to compare the amplitude signal to a first reference signal;
a second comparator circuit configured to compare the amplitude signal to a second reference signal; and
a logic gate coupled to receive output signals of the first and the second comparator circuits.

10. The integrated circuit defined in claim 9 further comprising a finite state machine that controls the built-in test circuit during the test and that generates a control signal for controlling a gain of the device under test.

11. The integrated circuit defined in claim 9 wherein the amplitude detector comprises:
a first differential pair of transistors;
a second differential pair of transistors;
a first capacitor coupled to the first differential pair of transistors; and
a second capacitor coupled to the second differential pair of transistors.

12. An integrated circuit comprising:
a device under test selected from the group consisting of an amplifier circuit, a filter circuit, and an equalizer circuit; and
a built-in test circuit comprising an amplitude detector that generates an amplitude signal indicative of an amplitude of an output signal of the device under test during a test of an AC transfer characteristic of the device under test, wherein the amplitude detector is coupled to receive the output signal of the device under test,
wherein the amplitude detector comprises:
a rectifier and level shifter circuit comprising a first differential pair of transistors; and
a replica circuit comprising a second differential pair of transistors.

13. The integrated circuit defined in claim 12 wherein the amplitude detector further comprises:
a first capacitor coupled to emitters of the first differential pair of transistors;
a second capacitor coupled to emitters of the second differential pair of transistors;
a first resistor coupled between the first capacitor and a first output of the amplitude detector; and
a second resistor coupled between the second capacitor and a second output of the amplitude detector.

14. An integrated circuit comprising:
a device under test selected from the group consisting of an amplifier circuit, a filter circuit, and an equalizer circuit;
a built-in test circuit comprising an amplitude detector that generates an amplitude signal indicative of an amplitude of an output signal of the device under test during a test of an AC transfer characteristic of the device under test, wherein the amplitude detector is coupled to receive the output signal of the device under test;

a comparator circuit configured to compare the amplitude signal to a reference signal; and a finite state machine that generates a control signal for controlling a gain of the device under test, that generates a reference selection signal for selecting a voltage of the reference signal, and that generates a test output signal in response to a pass signal generated based on an output signal of the comparator.

15. A method for testing an analog device under test on an integrated circuit using a built-in test circuit, the method comprising:

generating an amplitude signal using an amplitude detector that is indicative of an amplitude of an output signal of the analog device under test during a test of a transfer characteristic of the analog device under test, wherein the analog device under test and the amplitude detector are in the integrated circuit;

comparing the amplitude signal to a first reference signal using a first comparator;

comparing the amplitude signal to a second reference signal using a second comparator; and controlling the test of the analog device under test using a finite state machine in the integrated circuit.

16. The method defined in claim 15 wherein the analog device under test is selected from the group consisting of an amplifier circuit, an equalizer circuit, and a filter circuit.

17. The integrated circuit of claim 1 wherein the analog device under test circuit is a filter circuit.

* * * * *